United States Patent
Caveney

(10) Patent No.: US 7,907,402 B2
(45) Date of Patent: Mar. 15, 2011

(54) COOLING SYSTEM

(75) Inventor: Jack E Caveney, Hinsdale, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 12/266,883

(22) Filed: Nov. 7, 2008

(65) Prior Publication Data
US 2009/0122484 A1 May 14, 2009

Related U.S. Application Data

(60) Provisional application No. 60/986,630, filed on Nov. 9, 2007.

(51) Int. Cl.
H05K 7/20 (2006.01)
G06F 1/20 (2006.01)

(52) U.S. Cl. ............... 361/694; 361/679.49; 361/679.5; 361/690; 361/692; 361/716; 312/223.2; 312/236; 454/184

(58) Field of Classification Search ............... 361/79.46, 361/679.48–679.51, 690, 692, 694–695, 361/724, 679.46; 165/80.3; 312/223.2, 236; 454/184; 211/26
See application file for complete search history.

(56) References Cited

U.S. PATENT DOCUMENTS

| | | | | |
|---|---|---|---|---|
| 3,298,195 A | * | 1/1967 | Raskhodoff | .................... 62/414 |
| 3,547,348 A | * | 12/1970 | Kruper | ........................ 236/44 B |
| 4,612,979 A | * | 9/1986 | Heitzig | .......................... 165/129 |
| 4,773,829 A | * | 9/1988 | Vettori | .......................... 417/366 |
| 4,774,631 A | * | 9/1988 | Okuyama et al. | ............. 361/695 |
| 5,216,579 A | | 6/1993 | Basara et al. | |
| 5,570,740 A | * | 11/1996 | Flores et al. | ............. 165/104.34 |
| 5,657,641 A | * | 8/1997 | Cunningham et al. | .......... 62/263 |
| 5,718,628 A | * | 2/1998 | Nakazato et al. | ............. 454/184 |
| 6,151,210 A | | 11/2000 | Cercioglu et al. | |
| 6,412,292 B2 | | 7/2002 | Spinazzola et al. | |
| 6,459,579 B1 | * | 10/2002 | Farmer et al. | ................. 361/695 |
| 6,494,050 B2 | | 12/2002 | Spinazzola et al. | |
| 6,494,779 B1 | | 12/2002 | Nicolai et al. | |
| 6,516,954 B2 | * | 2/2003 | Broome | .......................... 211/26 |
| 6,535,382 B2 | * | 3/2003 | Bishop et al. | ................. 361/690 |
| 6,557,357 B2 | | 5/2003 | Spinazzola et al. | |
| 6,574,970 B2 | | 6/2003 | Spinazzola et al. | |
| 6,616,524 B2 | * | 9/2003 | Storck et al. | .................. 454/184 |

(Continued)

FOREIGN PATENT DOCUMENTS
EP 1727411 A2 11/2006
(Continued)

Primary Examiner — Robert J Hoffberg
(74) Attorney, Agent, or Firm — Robert A. McCann; Christopher S. Clancy

(57) ABSTRACT

An electronic equipment cabinet configured to support electronic equipment is provided and may include a shelf positioned in the cabinet separating the cabinet into a first zone and a second zone. The first and second zones may be in fluid communication with a cool air source. In some examples, the first zone may receive cool air directly from a cool air source and the second zone may receive cool air from a duct in fluid communication with the cool air source. In another example, both the first and second zones may receive cool air from the cool air source through a duct. In yet other examples, the cabinet may include a baffle between the cool air source and one of the first zones and the second zones to selectively control a quantity of cool air provided to the one of the first and second zones.

6 Claims, 12 Drawing Sheets

U.S. PATENT DOCUMENTS

| | | | |
|---|---|---|---|
| 6,668,565 B1 * | 12/2003 | Johnson et al. | 62/89 |
| 6,722,151 B2 * | 4/2004 | Spinazzola et al. | 62/259.2 |
| 6,745,579 B2 * | 6/2004 | Spinazzola et al. | 62/89 |
| 6,880,349 B2 * | 4/2005 | Johnson et al. | 62/89 |
| 6,924,977 B2 * | 8/2005 | Bestwick et al. | 361/679.51 |
| 6,927,980 B2 * | 8/2005 | Fukuda et al. | 361/700 |
| 7,033,267 B2 | 4/2006 | Rasmussen | |
| 7,074,123 B2 * | 7/2006 | Bettridge et al. | 454/184 |
| 7,226,353 B2 * | 6/2007 | Bettridge et al. | 454/184 |
| 7,236,362 B2 * | 6/2007 | Wang et al. | 361/695 |
| 7,259,961 B2 * | 8/2007 | Lucero et al. | 361/695 |
| 7,330,350 B2 * | 2/2008 | Hellriegel et al. | 361/679.48 |
| 7,362,571 B2 * | 4/2008 | Kelley et al. | 361/694 |
| 2005/0153649 A1 | 7/2005 | Bettridge et al. | |
| 2007/0171610 A1 * | 7/2007 | Lewis | 361/691 |
| 2007/0173189 A1 * | 7/2007 | Lewis | 454/184 |
| 2008/0098763 A1 * | 5/2008 | Yamaoka | 62/259.2 |
| 2008/0259563 A1 | 10/2008 | Fukuda et al. | |
| 2009/0061755 A1 * | 3/2009 | Calder et al. | 454/184 |
| 2010/0141105 A1 * | 6/2010 | Slessman | 312/236 |
| 2010/0151781 A1 * | 6/2010 | Slessman et al. | 454/184 |

FOREIGN PATENT DOCUMENTS

| | | |
|---|---|---|
| WO | WO 02054552 A1 * | 7/2002 |
| WO | WO 2010040868 A1 * | 4/2010 |

* cited by examiner

COOLING SYSTEM

RELATED APPLICATIONS

The present application claims the benefit of U.S. Provisional Patent Application No. 60/986,630, filed Nov. 9, 2007, the entire contents of which are hereby incorporated by reference.

FIELD OF INVENTION

This invention relates to systems and methods for cooling electronic equipment in equipment cabinets. In particular, the invention relates to ducted cooling systems for directing cooled air through equipment cabinets for cooling electronic equipment.

BACKGROUND

In a typical data center, equipment cabinets are used to hold various types of electronic equipment, such as servers and other mission-critical data-processing equipment. When in use, the electronic equipment housed in the cabinets generates heat that must be extracted or damage to the equipment can result. As equipment densities in the cabinets increase, so do the heat extraction (cooling) needs. Today, in a typical data center, it is not unusual for electronic equipment to generate 10 kilowatts and beyond of heat per cabinet (typical range 2 to 20 kilowatts per cabinet).

Currently, one method for cooling the electronic equipment in a data center is the use of the "hot aisle/cold aisle" concept; that is cool, conditioned air flows underneath a raised floor and enters the room through perforated floor tiles. The perforated tiles are strategically placed in front of the cabinets (thus creating the "cold aisle") such that the cool air can be pulled into the cabinets, through a perforated door, to cool the equipment. The cool air picks up heat as it is drawn through the equipment by fans and then the warm air exits the back of the cabinet through another perforated door into the "hot aisle." The exiting warm air is eventually drawn back into the room air conditioners and the cooling cycle repeats.

Although it is reasonably effective, the hot aisle/cold aisle method of cooling electronic equipment can be very inefficient and has various drawbacks. For example, warm air that exits the cabinet into the hot aisle can be drawn back to the cold aisle via the action of the equipment fans and normal room air circulation. In addition, the perforated floor tiles must be carefully placed and sized to effectively cool the equipment. If equipment is added or changed, or if a tile is accidentally moved or covered up, inefficient cooling results and cooling must be increased. Finally, since the flow of cool air is not directed to the equipment that needs cooling, any change in the room configuration or even people standing in the aisles can disrupt the cool air flow. These disruptions result in a smaller portion of the cool air actually cooling the equipment, which further decreases efficiency. The inefficiencies of the hot aisle/cold aisle system lead to wasted energy (e.g. electricity to power the air conditioners), due to the need to "overcool" the data center to make up for cooling losses. In addition, data loss and downtime can result due to equipment damage from overheating.

Therefore, there is a need for a system and method for cooling electronic equipment in a cabinet that efficiently and effectively delivers cooled air where it is needed, with no warm air mixing. It would also be beneficial to eliminate the dependence on a cold aisle for cool air delivery, for example by sending the cooled air directly into the cabinet.

SUMMARY OF THE INVENTION

In one example, an electronic equipment cabinet configured to support electronic equipment is provided and may include a shelf positioned in the electronic equipment cabinet separating the electronic equipment cabinet into a first zone and a second zone with the second zone positioned above the first zone. The first zone may be configured to receive cool air directly from a cool air source. The cabinet may also include a duct associated with the electronic equipment cabinet and may include a first opening configured to receive cool air from the cool air source and a second opening configured to deliver cool air to the second zone.

In another example, an electronic equipment cabinet configured to support electronic equipment is provided and may include a shelf positioned in the electronic equipment cabinet separating the electronic equipment cabinet into a first zone and a second zone with the second zone positioned above the first zone. The cabinet may also include a duct associated with the electronic equipment cabinet and configured to receive cool air from the cool air source and deliver cool air to the first and second zones.

In a further example, an electronic equipment cabinet configured to support electronic equipment is provided and may include a shelf positioned in the electronic equipment cabinet separating the electronic equipment cabinet into a first zone and a second zone with the second zone positioned above the first zone. The first and second zones may be in fluid communication with a cool air source. The cabinet may also include a baffle positioned between the cool air source and one of the first zone and the second zone to selectively control delivery of cool air from the cool air source to the one of the first zone and the second zone.

BRIEF DESCRIPTION OF THE DRAWINGS

Certain examples of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular examples illustrated herein.

DETAILED DESCRIPTION

Figure 1:
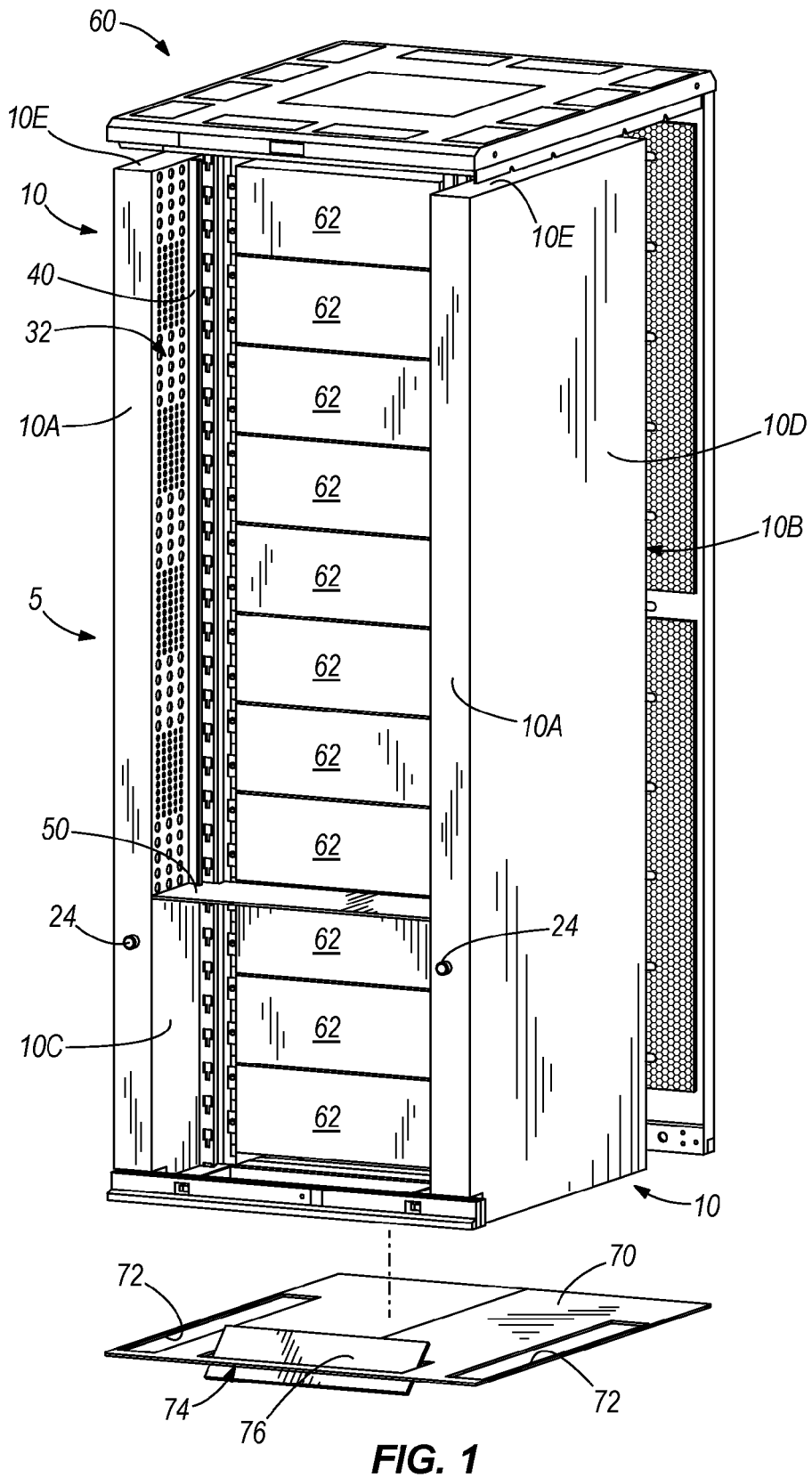
FIG. 1 is a front perspective view of one example of a cabinet cooling system installed in an electronic equipment cabinet with the front door and side panels removed and a floor tile exploded.
Figure 2:
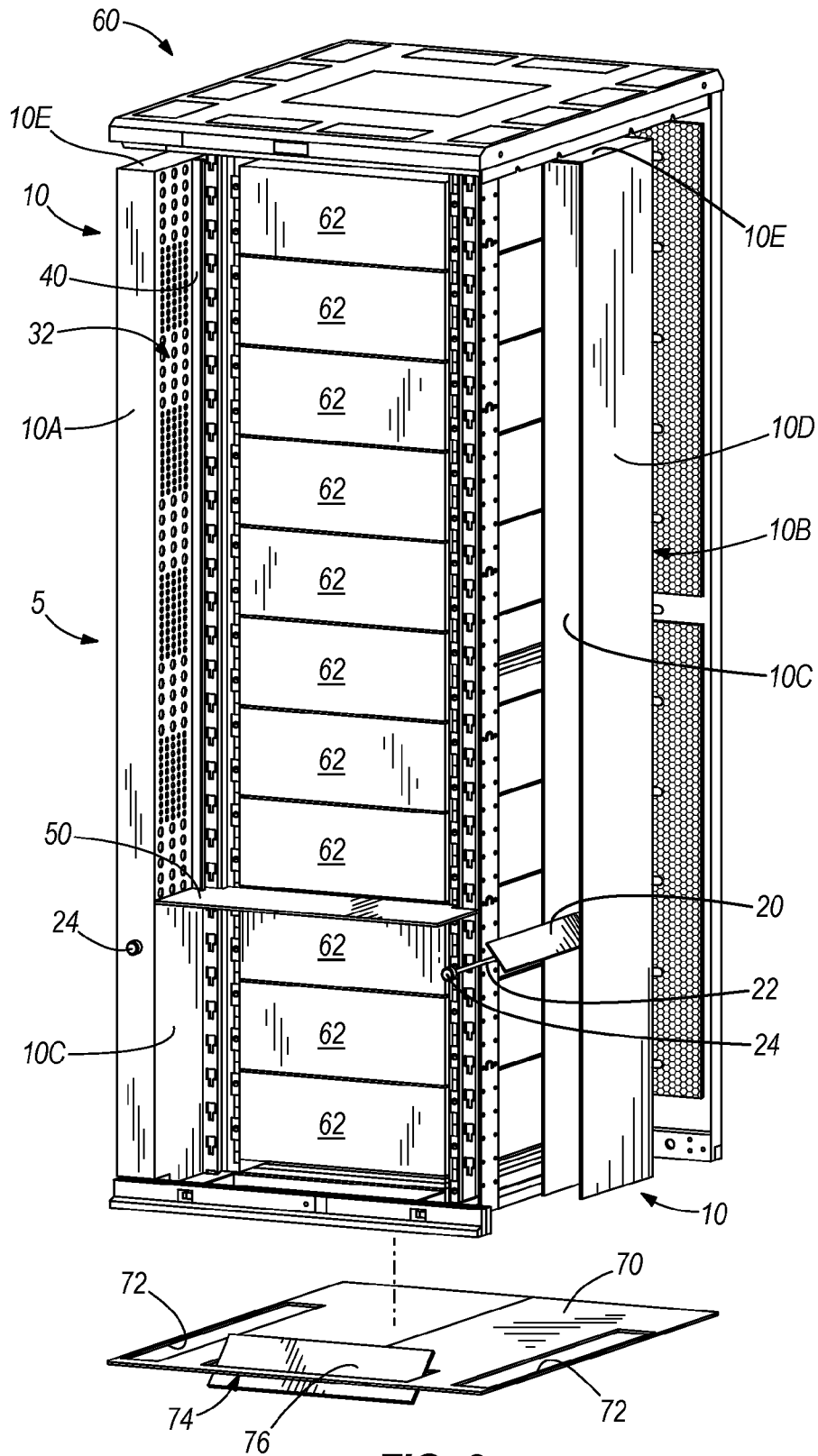
FIG. 2 is the cabinet cooling system of FIG. 1 with a portion of the right side duct removed.

Referring to FIGS. 1-2, one example of a cabinet cooling system 5 is shown installed in an electronic equipment cabinet 60 (the front door and side panels of cabinet 60 are removed for clarity). As shown and described herein, cabinet 60 is a network cabinet, such as that shown and described in co-pending U.S. patent application Ser. Nos. 11/467,956, 11/538,884, 11/559,708, 11/623,358, 11/623,839, and 11/683,052, which are incorporated herein by reference. However, it will be understood that cooling system 5 can be used with any type of cabinet that is adapted to carry electronic equipment, such as servers.

In this example, cooling system 5 is generally made up of ducts 10, which are minor images of each others and shelf 50. Each duct 10 is generally rectangular and is formed by front wall 10A, back wall 10B, inside wall 10C, outside wall 10D, top wall 10E, and a bottom wall (not shown). As used herein, inside wall 10C is the wall of duct 10 that faces electronic equipment 62 in the interior of cabinet 60 when duct 10 is installed and front wall 10A is the wall of duct 10 that faces the front of cabinet 60 when duct 10 is installed. Although the exemplary ducts 10 are described herein as being generally rectangular, ducts 10 could be made of any shape or size required for a particular application or to fit a particular equipment cabinet. In the example shown herein, ducts 10 are approximately 20 inches×4.5 inches×84 inches.

Figure 1A:
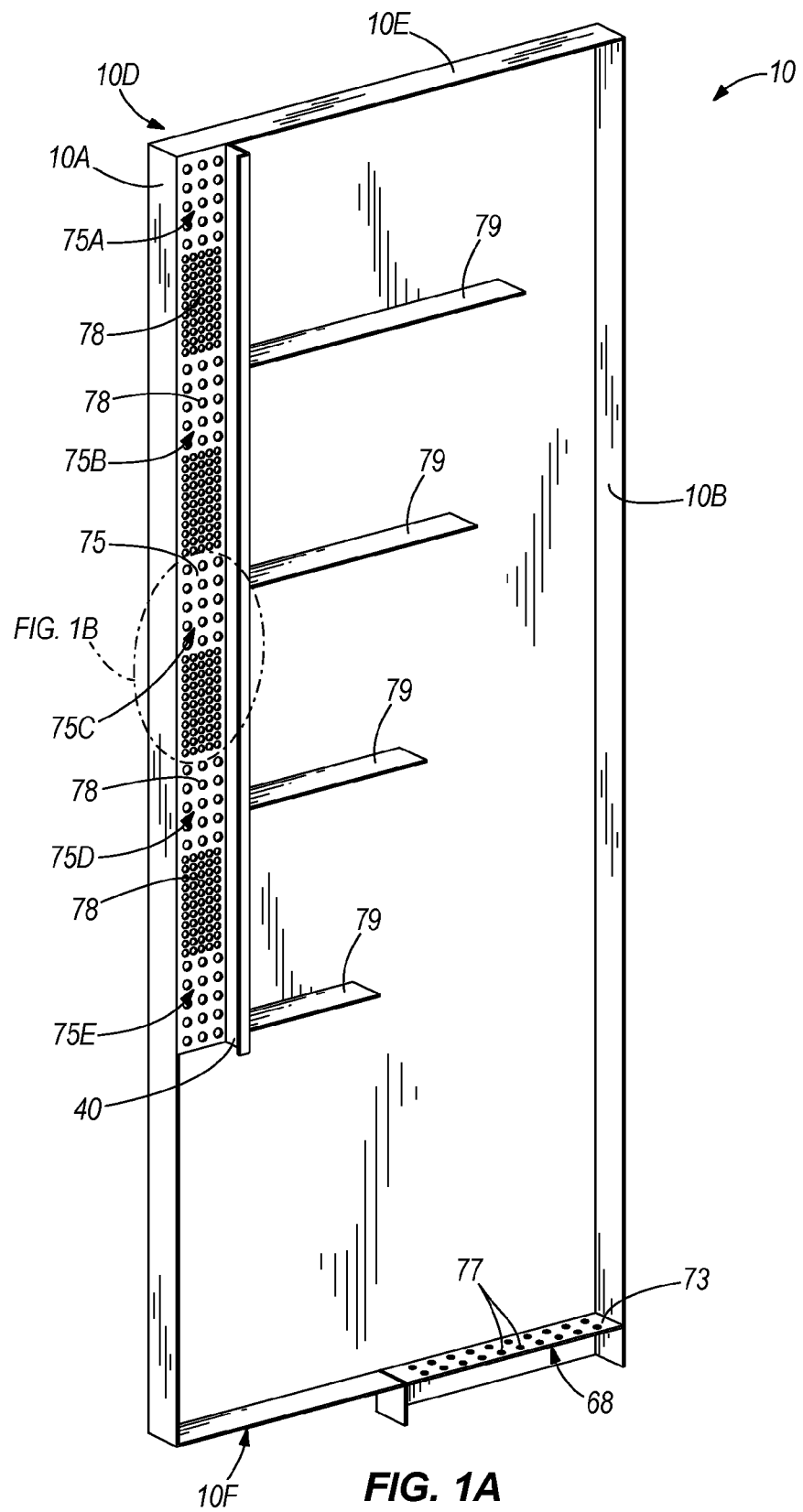
FIG. 1A is a front perspective view of a duct of the cabinet cooling system of FIG. 1 with an inside wall of the duct removed.

With particular reference to FIG. 1A, an intake opening 68 is formed in the bottom wall of duct 10 and is positioned such that the intake opening 68 will be aligned with a perforated or open cutout 72 in floor tile 70 when duct 10 is installed in cabinet 60. When installed, the intake opening 68 provides an inlet into duct 10 for cooled air flowing from cutout 72, which allows a typical perforated front cabinet door to be replaced by a solid cabinet door, if desired, and allows the flow of cool air from under the floor to enter duct 10.

With continued reference to FIG. 1A, a perforated intake panel 73 may be positioned over the intake opening 68 to deliver more uniform air flow to duct 10. In the example shown, perforated intake panel 73 includes multiple holes 77 and is positioned over opening 68 to deliver more uniform air flow to duct 10. Holes 77 are formed in intake panel 73 such that intake panel 73 is approximately 56% open. Alternatively, the intake panel 73 may include more or less holes 77 to respectively increase or decrease the openness of the intake panel. In some instances, it has been found that wide-open inlets may not provide consistent airflow into duct 10 (e.g. the air entering duct 10 will try to take the path of least resistance, so some areas will receive more cool air and be overcooled while others will not receive enough cool air and will be starved). In these instances, the use of a perforated intake panel 73 has been shown to provide more uniform air flow over the entire area of the intake opening 68 by converting high velocity, low pressure air into low velocity, high pressure air. If uniform air flow through the duct 10 is not a problem or concern in a particular application, the perforated intake panel 73 is not needed.

Figure 1B:
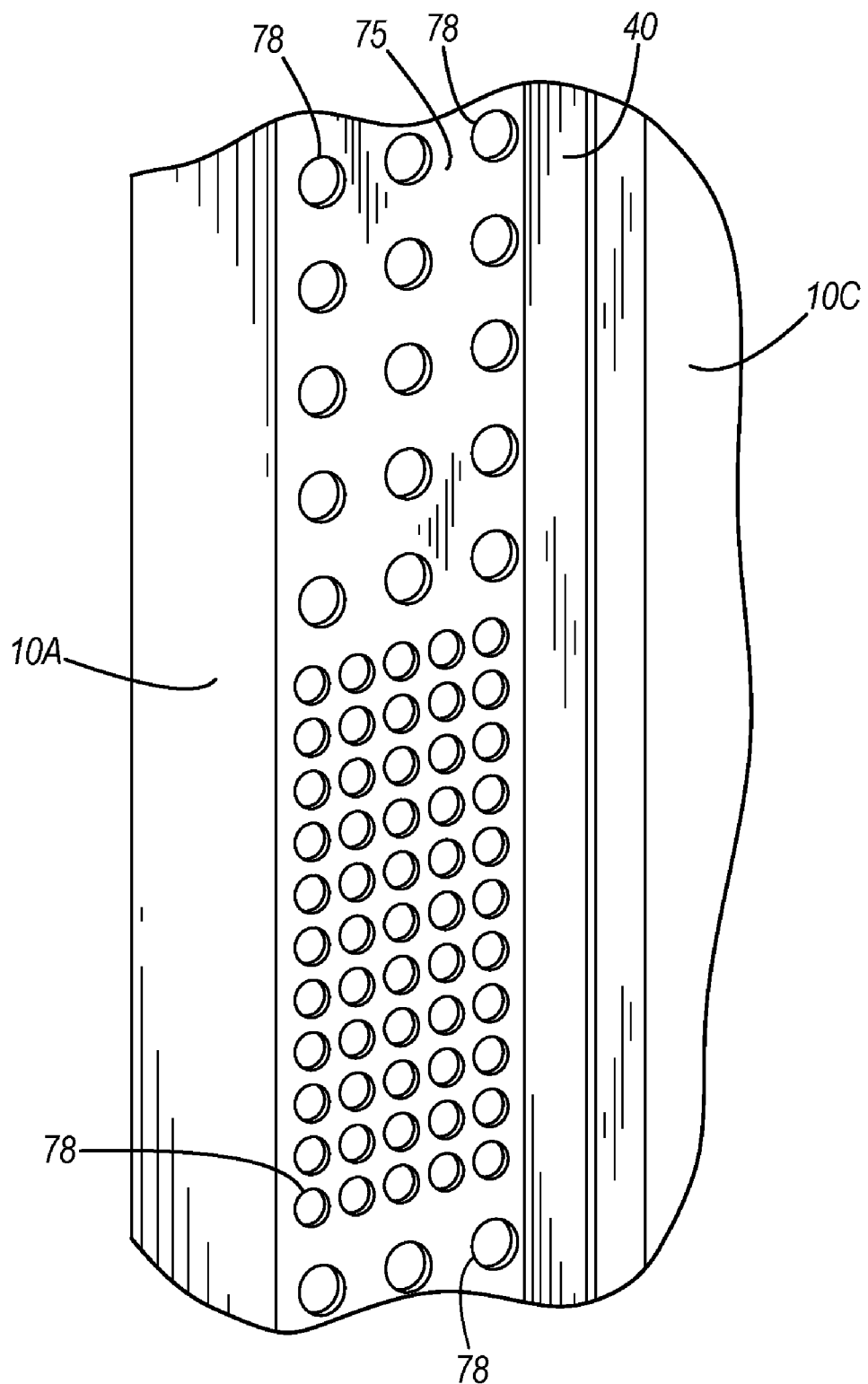
FIG. 1B is an enlarged view of a portion of the duct designated as FIG. 1B in FIG. 1A.

Referring to FIGS. 1, 1A, and 1B, opening 32 is formed in inside wall 10C and, in the example shown, extends from top wall 10E downward approximately 70% of the height of inside wall 10C and back a predetermined distance from front wall 10A. Alternatively, the opening 32 can extend along greater or less heights of the inside wall 10C. Opening 32 provides an exhaust for cool air out of duct 10 and directs the cool air flowing through duct 10 towards the front of electronic equipment 62 mounted in cabinet 60.

In addition, a perforated exhaust panel 75 may be positioned over opening 32 to more uniformly disperse the cool air flowing out of duct 10. In the example shown, perforated exhaust panel 75 includes multiple holes 78 and is positioned over the opening 32 in inside wall 10C to more uniformly disperse the cool air flowing out of duct 10. As can best be seen in FIGS. 1, 1A, and 1B, holes 78 are patterned such that each section 75A-E has an upper portion that is approximately 30% open and a lower portion that is approximately 36% open. Alternatively, each section 75A-E may include upper and lower sections with more or less openness as desired. In some instances, it has been found that a wide-open exhaust draws too much air in some areas of the exhaust, while causing starvation in other areas. In these instances, the use of the perforated exhaust panel 75 more uniformly disperses the cool air as it leaves duct 10 to enter the area in front of electronic equipment 62. If uniform air flow out of the duct 10 is not a problem or concern in a particular application, the perforated exhaust panel 75 is not needed.

With continued reference to FIGS. 1, 1A, and 1B and additional reference to FIG. 2, to further assist in providing uniform air flow from duct 10 across the front of electronic equipment 62, deflector 40 extends from inside wall 10C along the edge of opening 32. Deflector 40 is generally L-shaped, extends the entire height of opening 32, and is used to force all air to the front of equipment 62 and prevent cool air from flowing past the face of equipment 62 by disrupting the cool air flowing from opening 32, thus providing more uniform air flow across the entire front of equipment 62. Again, if uniform air flow across the front of equipment 62 is not a problem or concern in a particular application, deflector 40 may not be needed.

As can be seen in FIG. 1A, in this example, baffles 79 are also positioned in the interior of duct 10 and extend horizontally through duct 10 between outside wall 10D, front wall 10A, and inside wall 10C. As shown herein, there are four baffles 79, each baffle 79 being positioned near the bottom of one of the defined sections 75A-E of exhaust panel 75. Each baffle 79 has a different length, with the length of the baffles 79 increasing the higher the position in duct 10 or the further away the baffle 79 is from intake panel 73. In some instances, it has been found that completely open ducts result in more cool air exiting at the top of the duct (e.g. from the momentum of the air driving it to the top of the duct), thereby starring the lower sections of the duct. Baffles 79 can be used to control the direction, velocity and pressure of the cool air flow by breaking up the vertical air flows and directing the air flow sideways towards the front of the duct 10. Alternatively, if the flow of cool air through the duct 10 is not a problem or concern in a particular application, baffles 79 can be removed.

With particular reference to FIG. 2, the illustrated example of each duct 10 also includes an adjustable baffle 20. Baffle 20 is connected to rod 22, which extends through duct 10 and protrudes through holes in front wall 10A and back wall 10B of duct 10 (also see FIG. 1). The longitudinal axis of rod 22 is parallel to the longitudinal axis of baffle 20 such that rotation of rod 22 also rotates baffle 20 about its longitudinal axis. Knob 24 is also connected to rod 22 and allows a user to adjust baffle 20 from outside of duct 10 (also see FIG. 1). In the example shown in FIG. 2, baffle 20 is in a partially closed position such that baffle 20 is limiting the flow of cool air through duct 10. However, baffle 20 can be positioned in a fully closed position (generally horizontal) such that the flow of cool air will be blocked, in a fully open position (generally vertical) such that the flow of cool air will not be impeded, or in any intermediate position, which will allow control of the amount of cool air provided through duct 10 to equipment 62.

Shelf 50 extends between ducts 10 and is positioned just below openings 32. In this position, shelf 50 keeps the cool air exhausted from opening 32 within the upper portion of cabinet 60. Shelf 50 can be mounted to the frame of cabinet 60 or can be connected to inside walls 10C of ducts 10. In addition, cutout 74 is formed in floor tile 70 such that it is vertically aligned below shelf 50 to provide cooling air to equipment 62 disposed below shelf 50. In this instance, shelf 50 will also keep cool air from cutout 74 within the bottom portion of cabinet 60. To assist in controlling the amount of cool air supplied to the bottom portion of cabinet 60, moveable baffle 76 is positioned with cutout 74 such that baffle 76 can be positioned to allow full air flow through cutout 74, prevent all air flow through cutout 74, or be adjusted to allow any amount of air flow desired. In the illustrated example, the shelf 50 divides the cabinet 60 into two separately controlled zones. The first zone is above the shelf 50 and is provided with air through the ducts 10 and openings 32, while the second zone is below the shelf 50 and is provided with air through cutout 74. By separating the bottom portion of cabinet 60 from the upper portion with shelf 50 (i.e., into two zones) and providing a separate cool air source through cutout 74, electronic equipment 62, which typically received the smallest amount of cool air, is provided with sufficient cool air without diminishing the cool air supply to equipment 62 located in the upper portion of cabinet 60.

In operation, cool air from cutouts 72 flows through the openings in the bottom walls of ducts 10, through ducts 10, and is exhausted through openings 32 into the upper front portion of cabinet 60. The amount of cool air flowing through ducts 10 can be controlled with baffles 20. The cool air exiting openings 32 passes over deflectors 40, which disrupt the cool air flow, thereby preventing the cool air from flowing past the front of electronic equipment 62 and providing uniform distribution exclusively to the front of electronic equipment 62. Shelf 50 prevents the cool air from flowing into the bottom portion of cabinet 60, ensuring that all of the cool air is available to equipment 62 located in the upper portion of cabinet 60. In addition, cool air from cutout 74 flows directly into the bottom portion of cabinet 60 and can be controlled with baffle 76. Shelf 50 prevents the cool air from cutout 74 from flowing into the upper portion of cabinet 60, ensuring that all of the cool air is available to equipment 62 located in the lower portion of cabinet 60.

The exemplary cooling system 5 described above provides cool air, in the proper location, with no mixing of warm air from a hot aisle through the locating, sizing, and shaping of ducts 10, as well as the strategic placement of baffles 20, 76 and shelf 50 to control air direction, pressure and velocity. Some additional benefits that may be realized through use of the exemplary cooling system 5 are: it provides all of the cool air required by the cabinet, not just supplemental air to add to hot/cold aisle air; the ability to use a solid front door on the cabinet instead of a perforated door, which prevents unwanted air from entering the cabinet; the delivery of cool air along the full height of the cabinet, not just top or bottom; reduced energy costs; reduction of the number of perforated floor tiles required; and direction of the cool air to the front of the cabinet where it is needed most.

Figure 3:
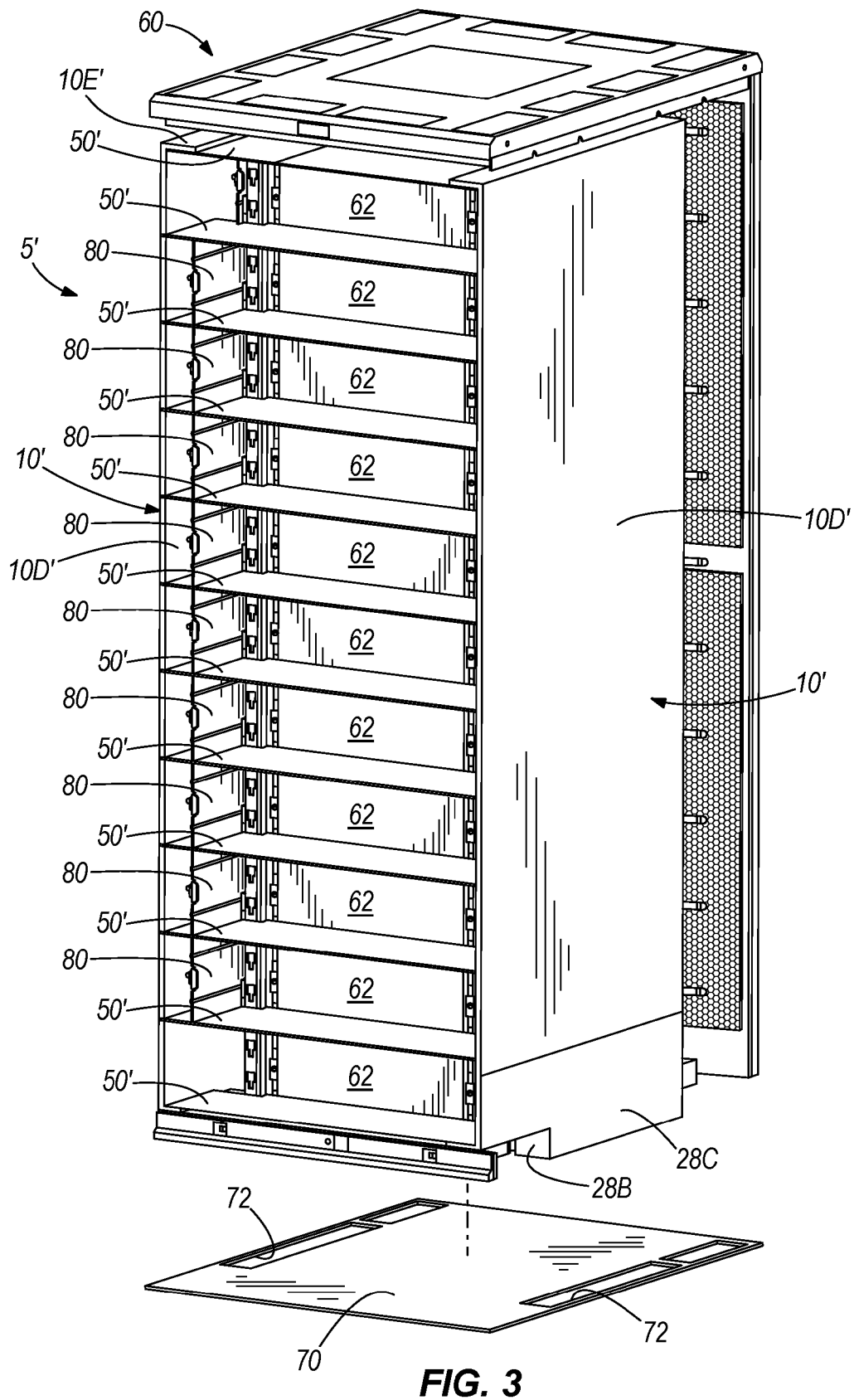
FIG. 3 is a front perspective view of a second example of a cabinet cooling system installed in an electronic equipment cabinet with the front door and side panels removed and a floor tile exploded.
Figure 4:
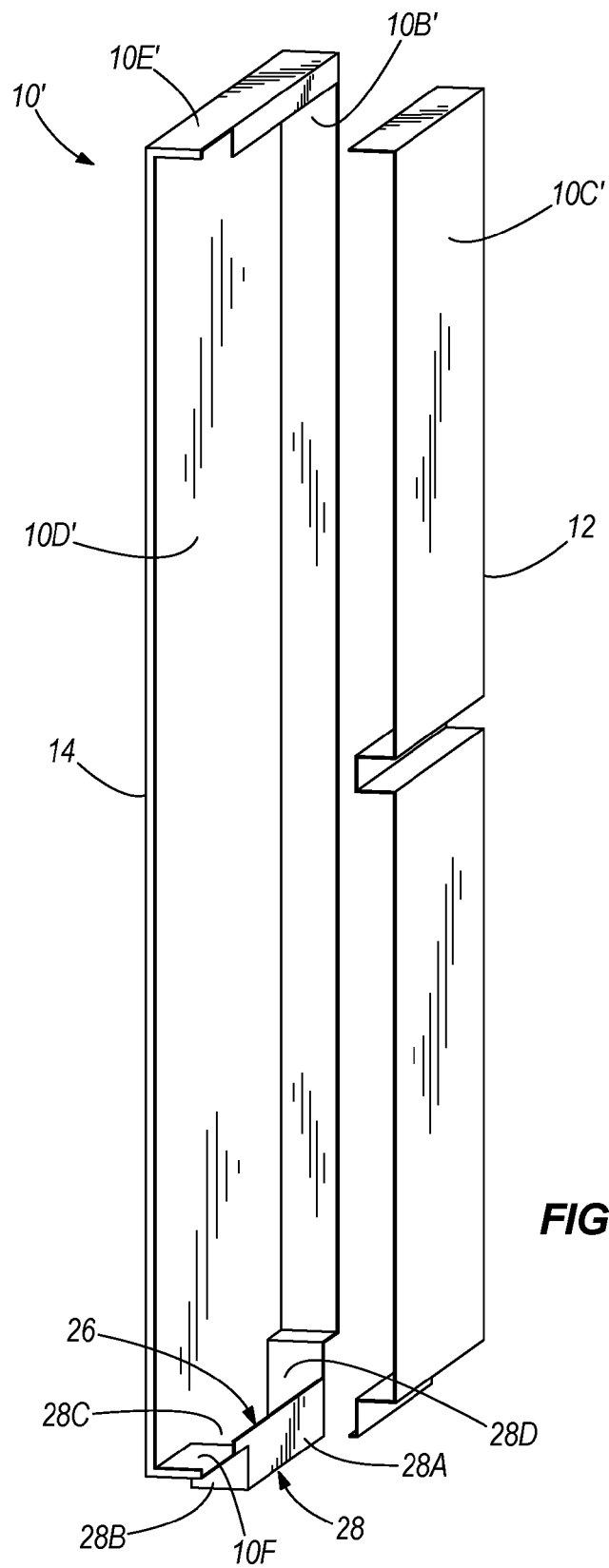
FIG. 4 is an exploded front perspective view of one of the ducts of FIG. 3.
Figure 5:
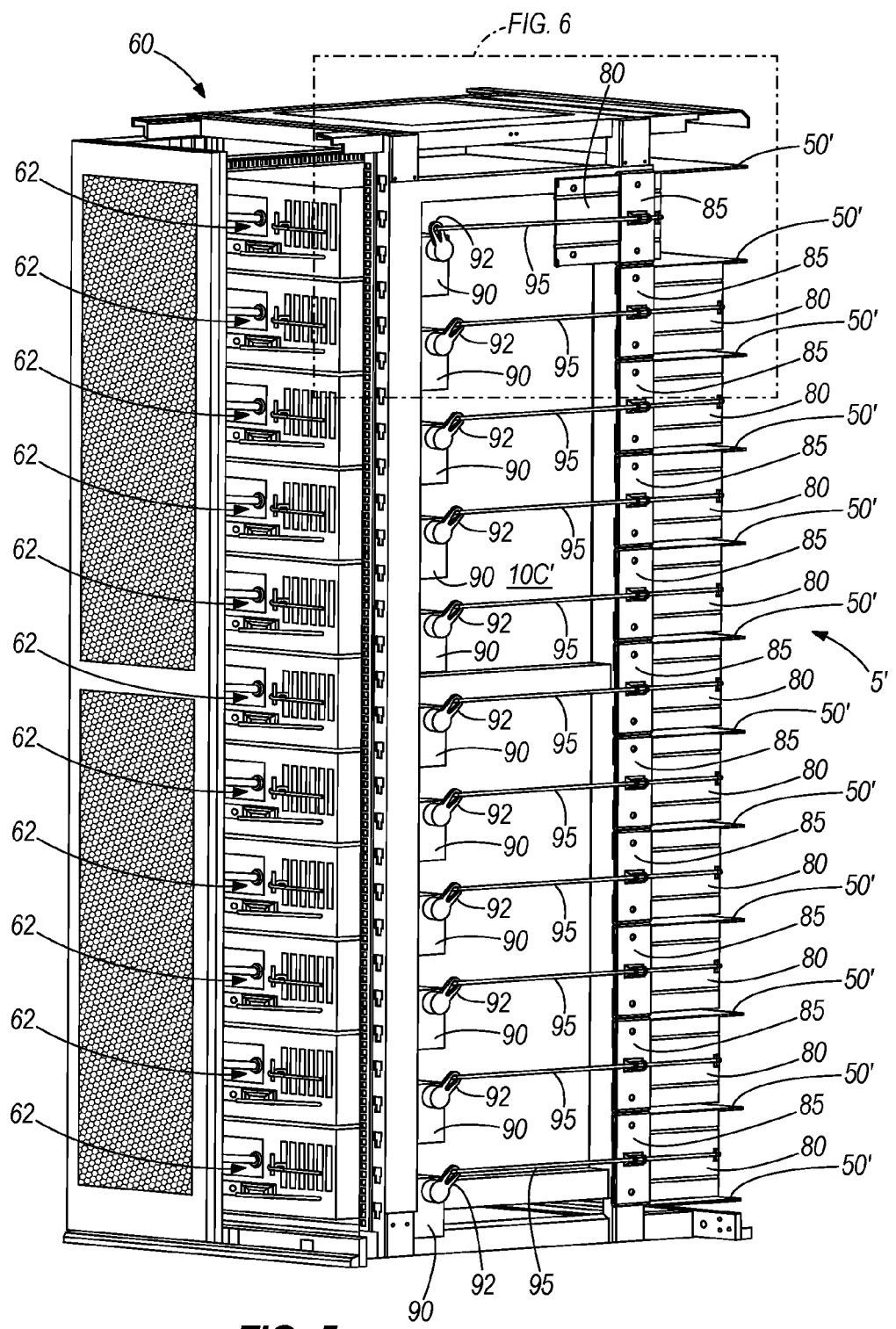
FIG. 5 is a rear perspective view of the cabinet cooling system of FIG. 3 with a portion of the duct removed.
Figure 6:
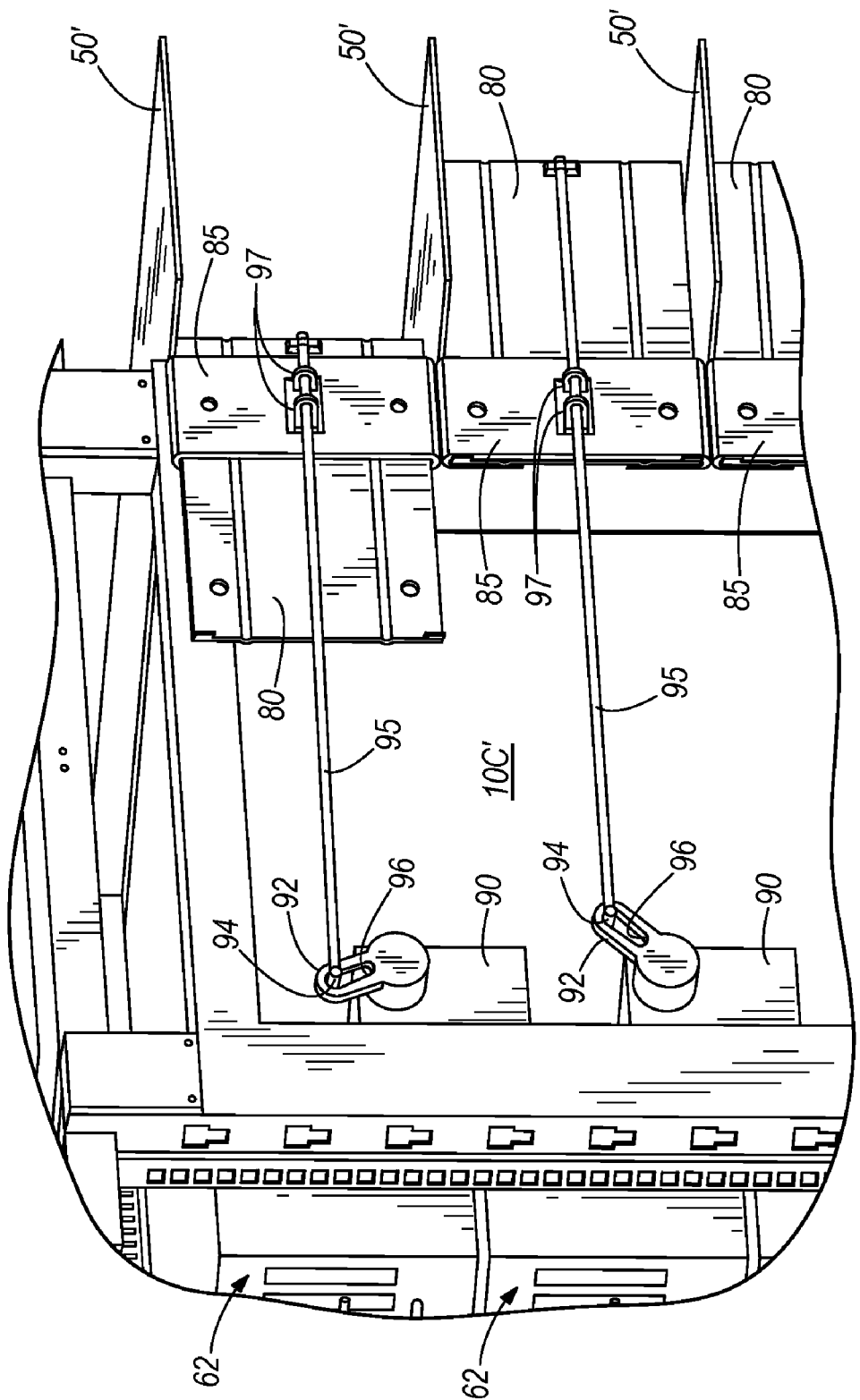
FIG. 6 is an enlarged partial view designated as FIG. 6 in FIG. 5.

Referring to FIGS. 3-6, a second example of a cooling system 5' is shown, which in FIGS. 3, 5, and 6 is shown installed in electronic equipment cabinet 60 (front door, side panels, and one rear door have been removed for clarity). In this example, cooling system 5' is generally made up of ducts 10', which are mirror images of each other, and shelves 50'. As can best be seen in FIG. 4, in this example each duct 10' is formed by inside section 12 and outside section 14, which are connected to form duct 10'. When inside section 12 and outside section 14 are connected, duct 10' is generally rectangular and has back wall 10B' inside wall 10C, outside wall 10D', top wall 10E', and bottom wall 10F. As used herein inside wall 10C' is the wall of duct 10' that faces electronic equipment 62 in the interior of cabinet 60 when duct 10' is installed and back wall 10B is the wall of duct 10' that faces the rear of cabinet 60 when duct 10' is installed. Although the exemplary ducts 10' are described herein as being generally rectangular, ducts 10' could be made of any shape or size required for a particular application or to fit a particular equipment cabinet.

Intake opening 26 (see FIG. 4) is formed in bottom wall 10F and is positioned such that intake opening 26 will be aligned with perforated or open cutout 72 in floor tile 70 when duct 10' is installed in cabinet 60. Extension member 28 which in this example is formed by vertical walls 28A-D, extends from bottom wall 10F and surrounds intake opening 26 to assist in directing cool air from cutouts 72 to intake opening 26. As shown in FIG. 3, wall 28C can be an extension of outside wall 10D'. When installed, intake opening 26 and extension member 28 provide an inlet into duct 10' for cooled air flowing from cutout 72, which allows a typical perforated front cabinet door to be replaced by a solid door, if desired, and allows the flow of cool air from under the floor to enter duct 10'.

In addition, a perforated intake panel similar to the perforated intake panel 73 shown in FIG. 1 may be positioned over intake opening 26 to deliver more uniform air flow to duct 10'. In some instances, it has been found that wide-open inlets may not provide consistent airflow into duct 10' (e.g. the air entering duct 10' will try to take the path of least resistance, so some areas will receive more cool air and be overcooled while others will not receive enough cool air and will be starved). In these instances, the use of a perforated intake panel has been shown to provide more uniform air flow over the entire area of intake opening 26 by converting high velocity, low pressure air into low velocity, high pressure air. If uniform air flow through the duct is not a problem or concern in a particular application, the perforated intake panel is not needed.

As can best be seen in FIGS. 3 and 4, in this example, ducts 10' do not contain front walls, which allows cool air flowing through ducts 10' to be exhausted towards the front of cabinet 60. In addition, the width of outside section 14 is greater than the width of inside section 12, such that cool air directed toward the front of cabinet 60 can also be directed towards the front of electronic equipment 62 mounted in cabinet 60. In this particular example, it is intended that cool air flowing through duct 10' will flow towards the front of cabinet 60 and be deflected from the solid front door of cabinet 60 towards the front of equipment 62. However, rather than relying on a solid front door, duct 10' could also have a front wall similar to the front wall 10A shown in the example illustrated in FIGS. 1, 1A, 1B, and 2 and described above, which will deflect cool air flowing through duct 10' towards the front of equipment 62.

If desired, to further assist in providing uniform air flow from duct 10' across the front of electronic equipment 62, a deflector could also be used, one that is similar to the deflector 40 illustrated in FIGS. 1, 1A, 1B, and 2 and described above, that extends from inside wall 10C' along the front edge of inside section 12. As described above, the deflector could be generally L-shaped, extend the entire height of inside section 12, and used to force all air to the front of equipment 62 and prevent cool air from flowing past the face of equipment 62 by disrupting the cool air flowing from ducts 10', thus providing more uniform air flow across the entire front of equipment 62. If uniform air flow across the front of equipment 62 is not a problem or concern in a particular application, the deflector may not be needed.

In the illustrated example, shelves 50' extend between ducts 10' and are positioned every 4 rack units to form eleven separate zones and eleven separate intake areas in front of electronic equipment 62. Alternatively, any number of shelves 50' can be used to separate the cabinet 60 into any number of separate zones with each zone having its own intake area for air. In these positions, shelves 50' keep the cool air supplied to each intake area from migrating to adjacent zones and intake areas. Shelves 50' can be mounted to the frame of cabinet 60 or can be connected to outside walls 10D' of ducts 10'.

As can best be seen in FIGS. 5 and 6, baffles or plates 80 are positioned vertically along the inside surface of inside wall 10C' such that each plate 80 is aligned between a particular set of shelves 50'. Plates 80 are supported by generally U-shaped brackets 85, which are mounted to the frame of cabinet 60 and prevent the vertical or rotational movement of plates 80, while allowing plates 80 to move horizontally. When a plate 80 is moved into a fully forward position (extended fully toward the front door of cabinet 60), plate 80 will prevent cool air from flowing from duct 10' to the corresponding intake area between shelves 50'. When a plate 80 is retracted into a fully rearward position (as seen in the top plate 80 in FIGS. 5 and 6), plate 80 will allow cool air to flow from duct 10' to the corresponding intake area. Depending on the cooling requirements for the particular equipment corresponding to a particular intake area, the corresponding plate 80 could be fully opened to provide maximum cool air flow, fully closed to block all cool air flow, or positioned in any intermediate position to allow a regulated flow of cool air.

In this example the movement of plates 80 is controlled by motors 90, which are mounted to the inside surface of wall 10C' at the back edge of wall 10C'. Motors 90 could be AC powered, DC powered, or any other type of standard drive motor. A rotatable cane arm 92 is mounted to each motor 90 such that motors 90 can rotate cam arms 92 in both clockwise and counterclockwise directions. Connector rods 95 interconnect cam arms 92 and plates 80 such that as cam arms 92 rotate, connector rods 95 will moose plates 80 linearly either forward or backward. Connector rods 95 are connected to cam arms 92 by inserting an L-shaped tip 94 of each connector rod 95 through holes 96 formed in cam arms 92. Connector rods 95 are also attached to the front portion of plates 80 through a hinge mechanism.

Connector rods 95 are also supported by tongues 97 (see FIG. 6) formed on and extending from the surface of brackets 85. Holes are formed through tongues 97 and receive connector rods 95 to help support and stabilize connector rods 95.

Figure 10:
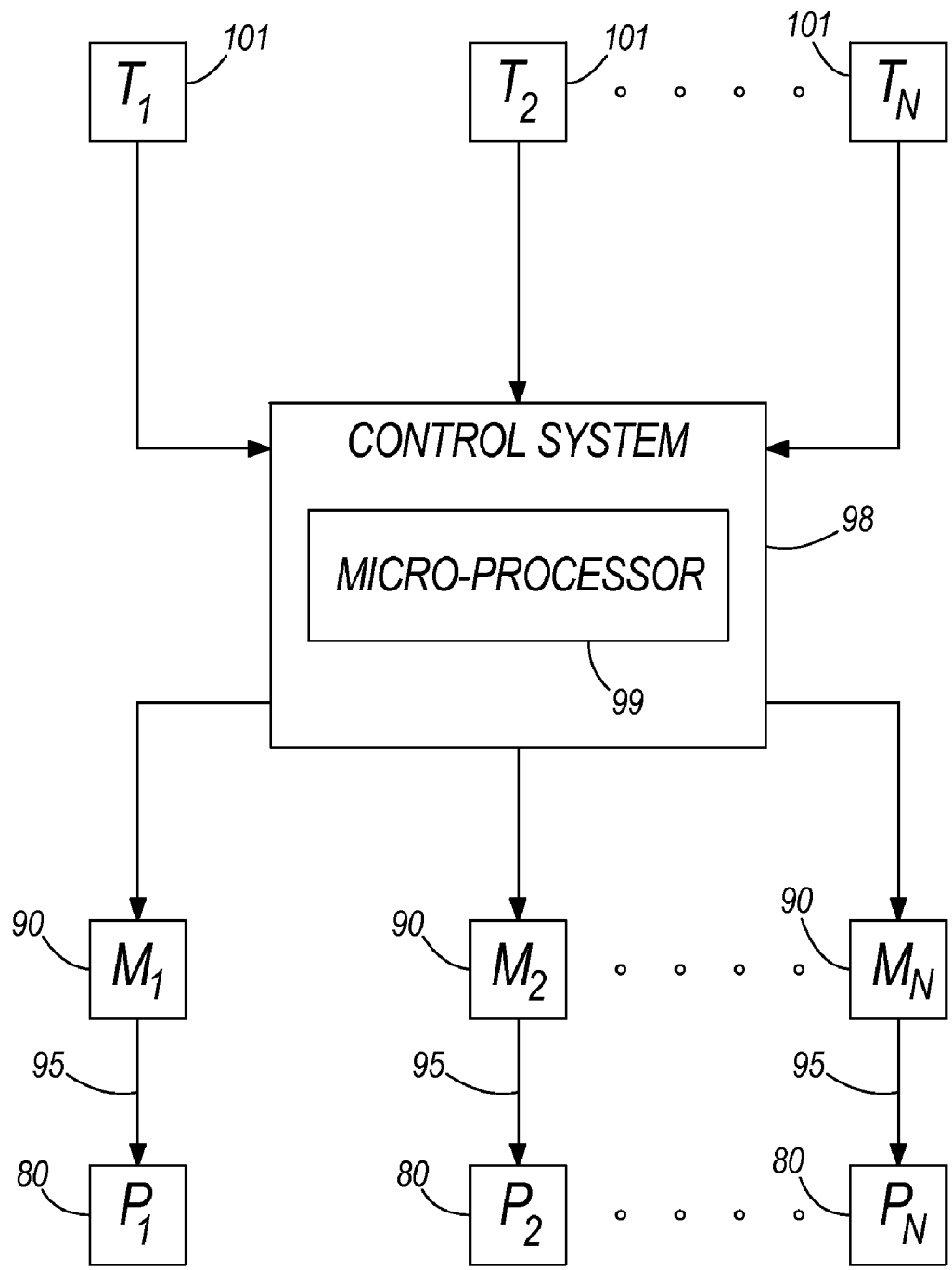
FIG. 10 is a schematic of at least a portion of the components of the cabinet cooling system in the exemplary embodiment of FIG. 3.

With reference to FIG. 10, motors 90 will extend or retract plates 80 based on signals received from a control system 98. The control system 98 may include a microprocessor 99 and a coded algorithm. Each motor 90 has a corresponding temperature sensor 101 that is positioned near the exhaust of the corresponding equipment 62 to monitor the temperature of the air being exhausted from equipment 62. If the exhaust air from tile equipment exceeds a predetermined acceptable temperature, motor 90 will rotate cam arm 92 in a counterclockwise direction, which will move the corresponding plate 80 backward and allow more cool air from duct 10' into the intake area corresponding to that equipment. If the exhaust air from the equipment drops below a predetermined acceptable temperature, motor 90 will rotate cam aim 92 in a clockwise direction, which will move the corresponding plate forward and allow less cool air from duct 10' into the intake area corresponding to that equipment.

In operation, cool air from cutouts 72 flows through extension members 28 and openings 26 in bottom walls 10F of ducts 10' and through ducts 10', where the cool air is directed to the front of cabinet 60. Depending on the positioning of plates 80, the cool air is then directed in the intake areas in the front portion of cabinet 60 between shelves 50'. The amount of cool air provided to each intake area is controlled by the position of plates 80. Shelves 50' prevent the cool air from migrating between intake areas, ensuring that all of the cool air is available to equipment 62 corresponding to each intake area.

The exemplary cooling system 5' described above provides cool air, in the proper location, with no mixing of warm air from a hot aisle through the locating, sizing, and shaping of ducts 10', as well as the strategic placement and control of shelves 50' and plates 80 to control air direction, pressure and velocity.

Some additional benefits that may be realized through use of the exemplary cooling system 5' are: it provides all of the cool air required by the cabinet, not just supplemental air to add to hot/cold aisle air; the ability to use a solid front door on the cabinet instead of a perforated door, which prevents unwanted air from entering the cabinet; the delivery of cool air to particular equipment as required; reduced energy costs; reduction of the number of perforated floor tiles required; and direction of the cool air to the front of the cabinet where it is needed most.

Figure 7:
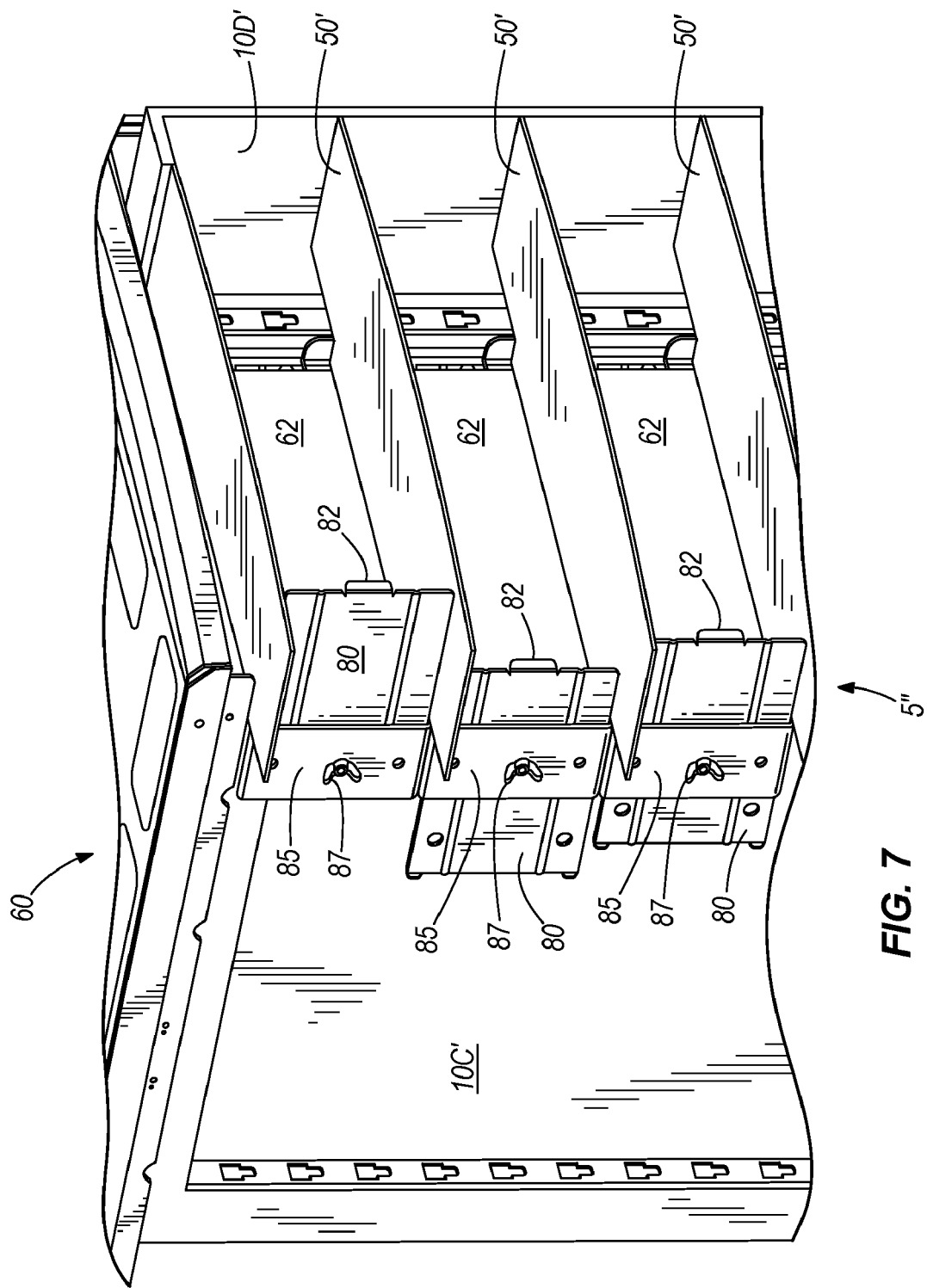
FIG. 7 is an enlarged partial side perspective view of a third example of a cabinet cooling system installed in an electronic equipment cabinet with the front door and side panels of the cabinet removed and a portion of the duct removed.

Referring to FIG. 7, a third example of a cooling system 5" is shown installed in electronic equipment cabinet 60 (front door, side panels, and one rear door have been removed for clarity). In this example, cooling system 5" is the same as cooling system 5' of FIGS. 3-6 in that it is generally made up of ducts 10', which are mirror images of each other, shelves 50', moveable plates 80, and U-shaped brackets 85, as described above for cooling system 5'.

However, in this example, cooling system 5" does not have motors 90, cam arms 92 or connector rods 95 to automatically adjust the position of plates 80. Rather, in cooling system 5", the position of plates 80 is adjusted manually by the user. To facilitate the manual adjustment of plates 80, each plate 80 has a tab 82 at the front end of the plates 80, which allows a user to grasp each plate 80 to adjust its position forward or back as desired. Once a plate 80 has been positioned, it can be secured by set screw 87, which is thread through a threaded aperture formed in bracket 85. As set screw 87 is tightened, it contacts and presses against the side of plate 80, thereby preventing plate 80 from being moved.

Figure 8:
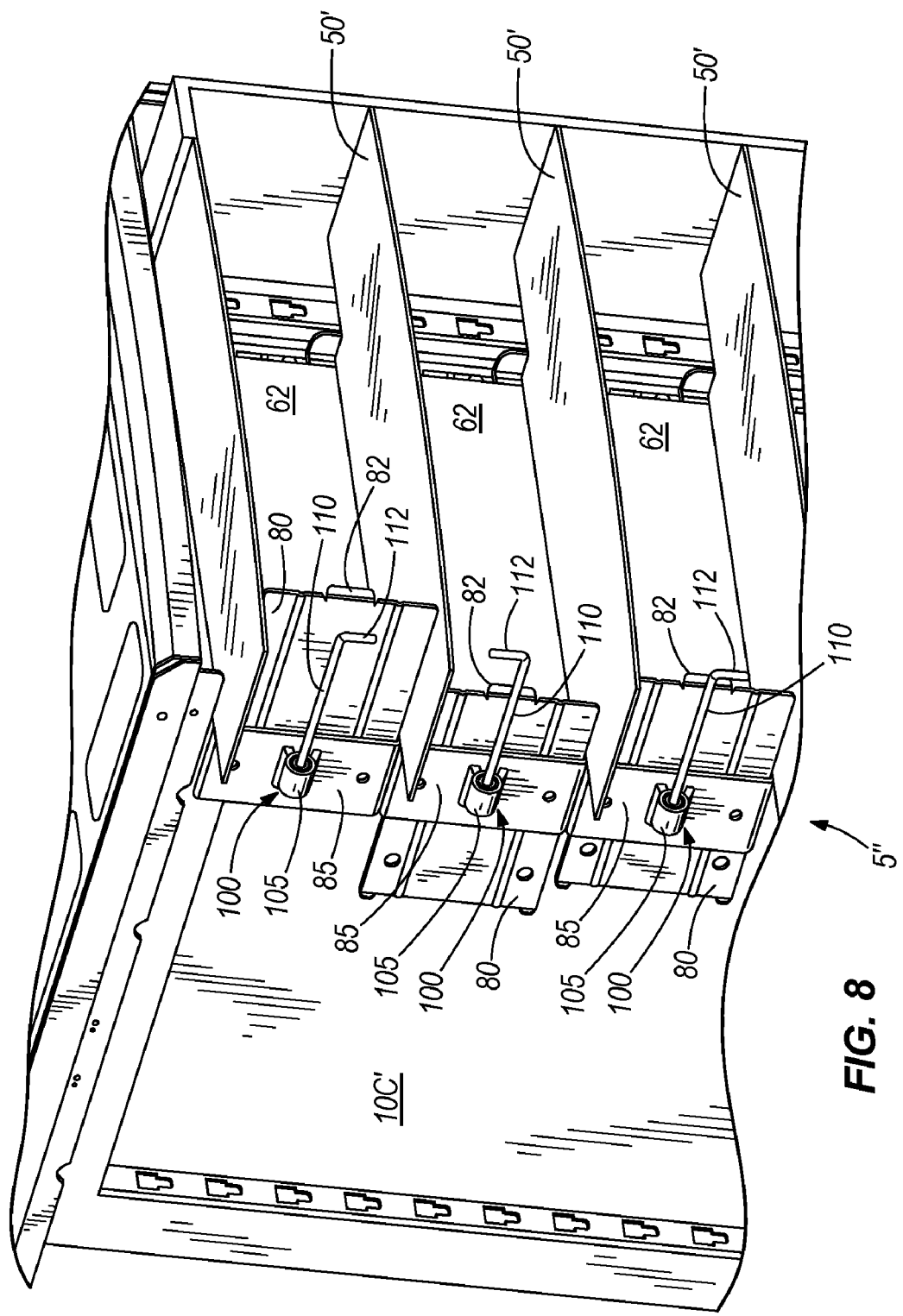
FIG. 8 is an enlarged partial side perspective view of the cabinet cooling system of FIG. 7 with an alternative locking mechanism.
Figure 9:
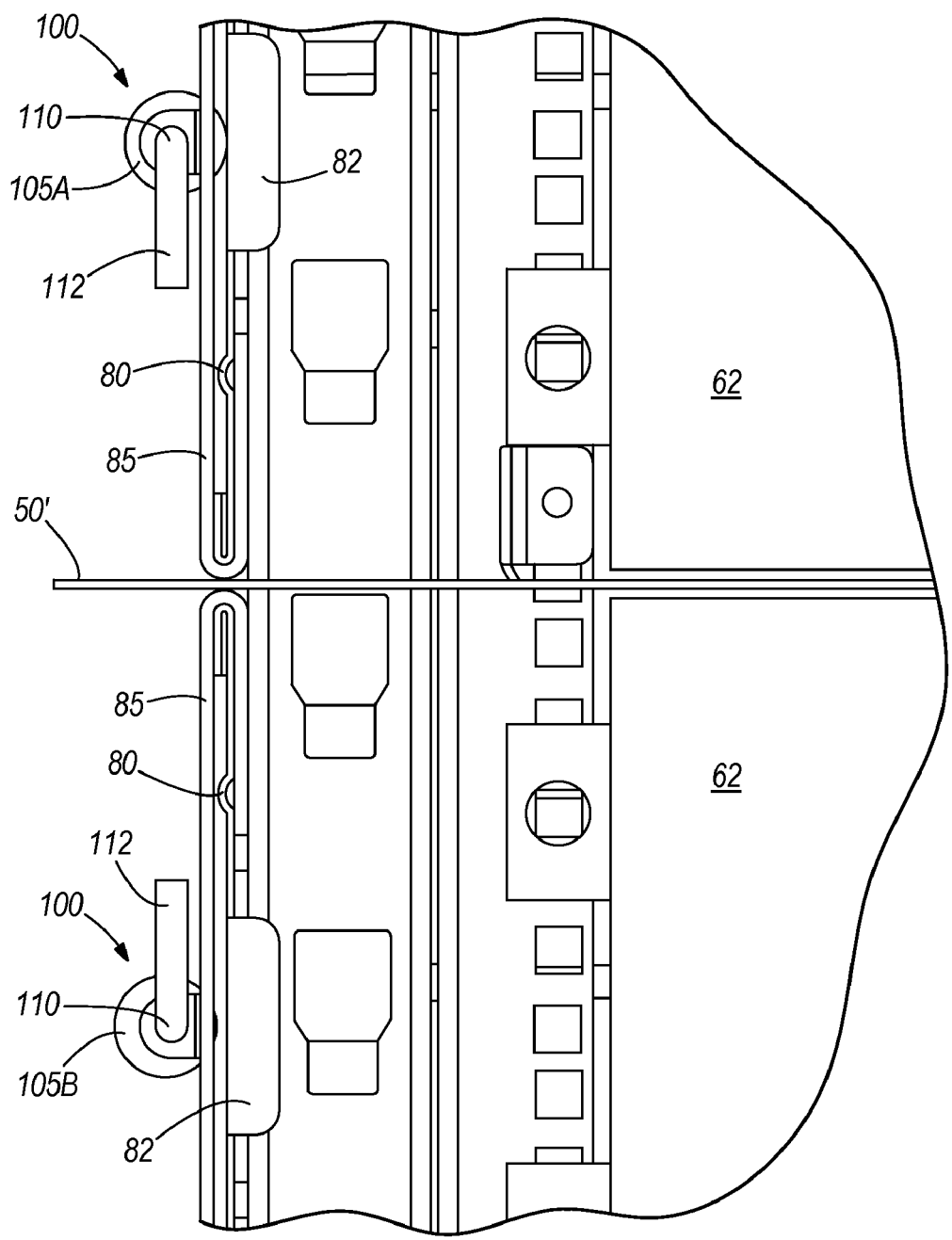
FIG. 9 is an enlarged partial front view of the cabinet cooling system of FIG. 8.

Referring to FIGS. 8 and 9, cooling system 5" of FIG. 7 is shown with an alternative locking mechanism in place of set screws 87. In the example shown in FIGS. 8 and 9, each bracket 85 has a cam-type locking mechanism 100 comprising a cylinder 105 that is eccentrically mounted on shaft 110 and can extend through an aperture in bracket 85. With cylinder 105 positioned such that the point on the surface of cylinder 105 closest to the axis of shaft 110 is adjacent plate 80 (see cylinder 105B in FIG. 9), cylinder 105 will not contact plate 80 and plate 80 will be free to move within bracket 85. With cylinder 105 positioned such that the point on the surface of cylinder 105 furthest from the axis of shaft 110 is adjacent plate 80 (see cylinder 105A in FIG. 9), cylinder 105 will provide through the aperture in bracket 85 and contact and press against the side of plate 80, thereby preventing plate 80 from being moved. One end of shaft 110, opposite cylinder 105, is bent at an angle of approximately 90 degrees relative to the remainder of the shaft 110 to provide a gripping portion 112, which allows a user to rotate shaft 110 and cylinder 105 to lock or unlock plate 80.

The foregoing description has been presented for purposes of illustration and description, and is not intended to be exhaustive or to limit the invention to the precise form disclosed. The descriptions were selected to explain the principles of the invention and their practical application to enable others skilled in the art to utilize the invention in various embodiments and various modifications as are suited to the particular use contemplated. Although particular constructions of the present invention have been shown and described, other alternative constructions will be apparent to those skilled in the art and are within the intended scope of the present invention.

I claim:

1. An electronic equipment cabinet configured to support electronic equipment comprising a first electronic equipment and a second electronic equipment, comprising:
   a front door;
   a shelf positioned in the electronic equipment cabinet separating the electronic equipment cabinet into a first zone configured to receive the first electronic equipment and a second zone configured to receive the second electronic equipment with the second zone positioned above the first zone, wherein the first zone is configured to receive a first portion of the cool air directly from a cool air source and the first portion of the cool air is received in the first zone between the front door and a front of the first electronic equipment received in the first zone and the shelf inhibits the first portion of the cool air received in the first zone between the front door and the front of the first electronic equipment from flowing to the second zone between the front door and a front of the second electrical equipment; and
   a duct positioned in a side portion of the electronic equipment cabinet and including
   a bottom wall,
   an inside wall facing the first electronic equipment and the second electronic equipment,
   a first opening formed in the bottom wall of the duct and configured to receive a second portion of the cool air directly from the cool air source, and
   a second opening formed in the inside wall of the duct and configured to deliver the second portion of the cool air to the second zone between the front door and the front of the second electronic equipment received in the second zone.

2. The electronic equipment cabinet of claim 1, wherein the duct is a first duct, the cabinet further comprising a second duct associated with the electronic equipment cabinet and including a third opening configured to receive a third portion of the cool air from the cool air source and a fourth opening configured to deliver the third portion of the cool air to the second zone.

3. The electronic equipment cabinet of claim 2, wherein the first duct is positioned in a first side portion of the electronic equipment cabinet and the second duct is positioned in a second side portion of the electronic equipment cabinet, and wherein the third opening is formed in a bottom wall of the second duct, and the fourth opening is formed in a second inside wall of the second duct with the second inside wall of the second duct facing the first electronic equipment and the second electronic equipment.

4. The electronic equipment cabinet of claim 1, further comprising a baffle positioned between the cool air source and one of the first zone or the second zone to selectively control delivery of one of the first portion or second portion of the cool air from the cool air source to the one of the first zone or the second zone.

5. The electronic equipment cabinet of claim 1, further comprising a floor tile and a cutout in the floor tile, wherein the cutout is in fluid communication with the cool air source and the first zone and the first portion of the cool air from the cool air source passes through the cutout on its way to the first zone.

6. The electronic equipment cabinet of claim 5, further comprising a baffle positioned in one of the duct or the cutout to selectively control delivery of one of the first portion or second portion of the cool air from the cool air source to the one of the duct or the cutout.

* * * * *

UNITED STATES PATENT AND TRADEMARK OFFICE
CERTIFICATE OF CORRECTION

| | |
|---|---|
| PATENT NO. | : 7,907,402 B2 |
| APPLICATION NO. | : 12/266883 |
| DATED | : March 15, 2011 |
| INVENTOR(S) | : Jack E. Caveney |

It is certified that error appears in the above-identified patent and that said Letters Patent is hereby corrected as shown below:

Column 6, line 15 which reads "and has back wall 10B' inside wall 10C, outside wall 10D'," should read "and has back wall 10B', inside wall 10C', outside wall 10D'."

Column 6, line 19 which reads "wall 10B is the wall of duct 10' that faces the rear of cabinet 60" should read "wall 10B' is the wall of duct 10' that faces the rear of cabinet 60."

Signed and Sealed this
Fifth Day of February, 2013

Teresa Stanek Rea
*Acting Director of the United States Patent and Trademark Office*